US011206008B2

(12) United States Patent
Dogiamis et al.

(10) Patent No.: US 11,206,008 B2
(45) Date of Patent: Dec. 21, 2021

(54) HYBRID FILTER ARCHITECTURE WITH INTEGRATED PASSIVES, ACOUSTIC WAVE RESONATORS AND HERMETICALLY SEALED CAVITIES BETWEEN TWO RESONATOR DIES

(71) Applicant: Intel Corporation, Santa Clara, CA (US)

(72) Inventors: Georgios C. Dogiamis, Chandler, AZ (US); Telesphor Kamgaing, Chandler, AZ (US); Feras Eid, Chandler, AZ (US); Vijay K. Nair, Mesa, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/648,115

(22) PCT Filed: Dec. 28, 2017

(86) PCT No.: PCT/US2017/068725
§ 371 (c)(1),
(2) Date: Mar. 17, 2020

(87) PCT Pub. No.: WO2019/132921
PCT Pub. Date: Jul. 4, 2019

(65) Prior Publication Data
US 2020/0259478 A1    Aug. 13, 2020

(51) Int. Cl.
*H03H 9/05* (2006.01)
*H03H 9/10* (2006.01)
(Continued)

(52) U.S. Cl.
CPC ........ *H03H 9/0547* (2013.01); *H03H 9/0533* (2013.01); *H03H 9/0542* (2013.01);
(Continued)

(58) Field of Classification Search
CPC .. H03H 9/0547; H03H 9/1014; H03H 9/1071; H03H 9/1092; H03H 9/105;
(Continued)

(56) References Cited

U.S. PATENT DOCUMENTS 7,378,922 B2 *   5/2008   Kubo ................. B81C 1/00238
                                                    333/133
2003/0227357 A1   12/2003   Metzger et al.
(Continued)

OTHER PUBLICATIONS

International Preliminary Report on Patentability for International Patent Application No. PCT/US2017/068725 dated Jul. 9, 2020, 10 pgs.
(Continued)

*Primary Examiner* — Robert J Pascal
*Assistant Examiner* — Jorge L Salazar, Jr.
(74) *Attorney, Agent, or Firm* — Schwabe, Williamson & Wyatt, P.C.

(57) ABSTRACT

Embodiments of the invention include an acoustic wave resonator (AWR) module. In an embodiment, the AWR module may include a first AWR substrate and a second AWR substrate affixed to the first AWR substrate. In an embodiment, the first AWR substrate and the second AWR substrate define a hermetically sealed cavity. A first AWR device may be positioned in the cavity and formed on the first AWR substrate, and a second AWR device may be positioned in the cavity and formed on the second AWR substrate. In an embodiment, a center frequency of the first AWR device is different than a center frequency of the second AWR device. In additional embodiment of the invention, the AWR module may be integrated into a hybrid filter.
(Continued)

The hybrid filter may include an AWR module and other RF passive devices embedded in a packaging substrate.

25 Claims, 7 Drawing Sheets

(51) Int. Cl.
*H03H 9/13* (2006.01)
*H03H 9/52* (2006.01)
*H03H 9/54* (2006.01)

(52) U.S. Cl.
CPC .............. *H03H 9/10* (2013.01); *H03H 9/105* (2013.01); *H03H 9/1014* (2013.01); *H03H 9/1071* (2013.01); *H03H 9/1092* (2013.01); *H03H 9/13* (2013.01); *H03H 9/52* (2013.01); *H03H 9/542* (2013.01)

(58) Field of Classification Search
CPC ...... H03H 9/0533; H03H 9/0542; H03H 9/10; H03H 9/13; H03H 9/52; H03H 9/542; H03H 9/059; H03H 9/1007; H03H 9/1064; H03H 9/0514

USPC .......................... 333/133, 187, 188, 193–196
See application file for complete search history.

(56) References Cited

U.S. PATENT DOCUMENTS

| | | |
|---|---|---|
| 2007/0115079 A1 | 5/2007 | Kubo et al. |
| 2007/0170565 A1 | 7/2007 | Hong et al. |
| 2012/0049978 A1 | 3/2012 | Pang et al. |
| 2014/0191825 A1* | 7/2014 | Son .................... H03H 9/173 |
| | | 333/189 |
| 2015/0145610 A1 | 5/2015 | Ruby et al. |

OTHER PUBLICATIONS

International Search Report and Written Opinion for International Patent Application No. PCT/US2017/068725 dated Sep. 20, 2018, 13 pgs.

* cited by examiner

HYBRID FILTER ARCHITECTURE WITH INTEGRATED PASSIVES, ACOUSTIC WAVE RESONATORS AND HERMETICALLY SEALED CAVITIES BETWEEN TWO RESONATOR DIES

CROSS-REFERENCE TO RELATED APPLICATION

This patent application is a U.S. National Phase Application under 35 U.S.C. § 371 of International Application No. PCT/US2017/068725, filed Dec. 28, 2017, entitled "HYBRID FILTER ARCHITECTURE WITH INTEGRATED PASSIVES, ACOUSTIC WAVE RESONATORS AND HERMETICALLY SEALED CAVITIES BETWEEN TWO RESONATOR DIES," which designates the United States of America, the entire disclosure of which is hereby incorporated by reference in its entirety and for all purposes.

TECHNICAL FIELD

Embodiments of the present disclosure relate to RF front end systems and more particularly to an RF front end system with an integrated and hermetically sealed acoustic wave resonator (AWR) module.

BACKGROUND

Filters operating at microwave frequencies are important in current and future generations of mobile and wireless communication devices and infrastructures. For example, in 5G communications, the amount of data to be generated and exchanged between user terminals and networks will increase substantially in comparison to 3G and 4G communications. The implementation of wireless access points for machine to machine communication will add to the already high number of filters that are currently being used in the radio front end module. These multi-radio platforms will require the use of highly selective filters with low passband insertion loss to guarantee the required signal integrity. Furthermore, the additional filters need broad frequency bandwidth to enable wireless high speed data transfer. Particularly, each user's terminal device should be able to process data at speeds averaging about 1 Gigabit per second with network latency below 10 ms. Broadband RF filters will be required to achieve the desired datarate without an increase in the network latency because they can enable architectures with relatively low order modulation schemes.

In previous generation mobile and wireless communication standards, cellular RF front end filters have traditionally used acoustic wave resonators arranged in lattice format, ladder format, or combinations of the two. However, the properties of the acoustic wave materials and associated resonators have been a limiting factor for achieving broadband filtering. Acoustic wave filters and resonators, however, remain attractive because they exhibit sharp roll-offs at the passband edge. Therefore, acoustic wave filters and resonators remain attractive because they exhibit frequency channels that are close to each other. For example, acoustic wave filters can be implemented with a guard band (i.e., a signal rejection range between two transmission bands) of only a few tens of MHz between them. Lumped element filters have been widely used in WiFi for personal computers, smartphones, tablets and desktops. Lumped element filters exhibit very broad passband frequency range (e.g., 100 MHz at around 2.4 GHz and almost 1 GHz around the WiFi upper band between 4.9 GHz and 5.8 GHz). Unfortunately, lumped element filters have very slow roll-off leading to filters with poor selectivity around the passband edge. This results in inefficient utilization of the frequency spectrum when lumped component filters are used in a multi-radio platform.

EMBODIMENTS OF THE PRESENT DISCLOSURE

Figure 1:
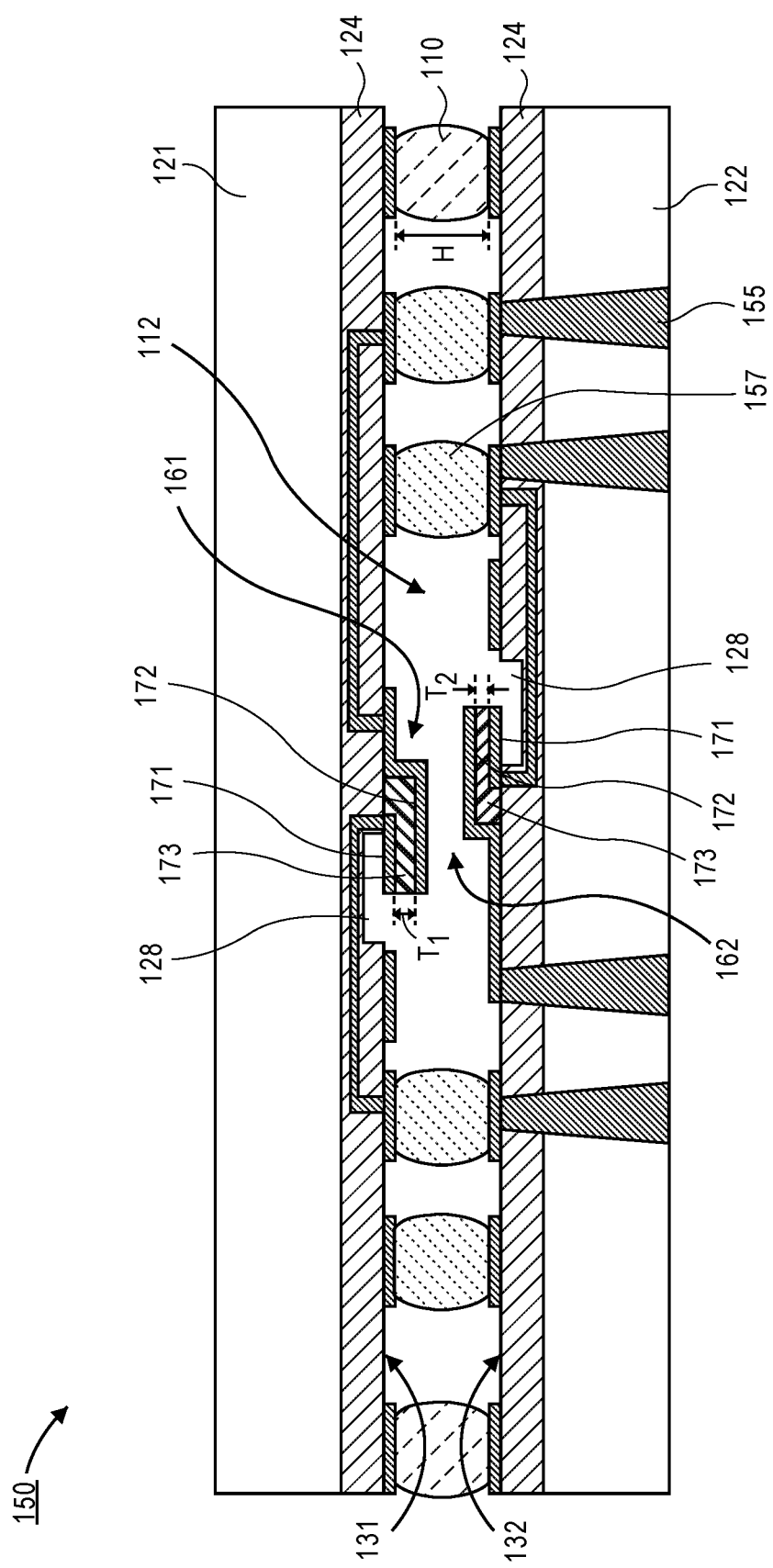
FIG. 1 is a cross-sectional illustration of an acoustic wave resonator (AWR) module with two AWR devices with different operating frequencies, according to an embodiment of the invention.

Described herein are systems that include hybrid filters that include acoustic wave resonators. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, neither an acoustic wave resonator nor a lumped element filter alone can provide the desired characteristics needed for future wireless communications in multi-radio platforms. Accordingly, embodiments of the invention may include hybrid filters that include a lumped element filter in parallel with an acoustic wave resonator. The combination of lumped element filters with acoustic wave filters provides a hybrid filter with improved selectivity while not significantly impacting the fractional bandwidth.

In particular embodiments, hybrid filters may include an acoustic wave resonator (AWR) module that includes two or more AWR devices. An AWR is a device that includes a piezoelectric layer contacted by two conductive electrodes. As used herein, an AWR device may be any well-known resonator, such as but not limited to a thin film bulk acoustic wave resonator (TFBAR), a solidly mounted resonator (SMR), a contour-mode resonator (CMR), a composite longitudinal mode resonator (CLMR), or a surface acoustic wave (SAW) device. In such devices, the center frequency of operation is defined by the thickness of a patterned piezoelectric material. Currently, it is challenging to implement resonators with widely-spaced resonance frequencies and high quality-factors. As such, it is typically necessary to fabricate AWR devices with different frequencies on different wafers and with different processing operations.

AWR devices are typically fabricated using a wafer level process. Accordingly, the thickness of each piezoelectric layer formed on a wafer is substantially similar unless additional masking and patterning operations (which increase costs and reduce throughput) are implemented. Even then, in AWR modules that include AWR devices with more than one center operating frequency, it remains challenging to obtain high quality factors when each of the AWR devices are formed on a single wafer. After the AWR devices are formed on the wafer, the AWR devices may be hermetically sealed for protection from the environment (e.g., humidity, dust, etc.). The sealing process can be a wafer level process, or the sealing process may be implemented at the AWR device die level.

Accordingly, embodiments of the invention may include hybrid filter architectures that that include AWR modules that include AWRs that operate at different center frequencies. As such, embodiments allow for hybrid filters that are able to obtain a wideband response. For example, embodiments of the invention may utilize wafer-to-wafer (or die-to-die) bonding of two AWR wafers. Since two wafers are used, the AWR devices on each wafer may have piezoelectric layers with different thicknesses, and therefore, may operate at different center frequencies. In such embodiments, the two wafers may be bonded face-to-face in order to provide a hermetic seal while allowing for high quality factor AWR devices with different frequencies to be used in the same hybrid filter architecture. Affixing two wafers face-to-face also allows for the elimination of individually capping and/or sealing each AWR wafer as well. This reduces assembly complexity and also decreases overall assembly cost. Furthermore, mounting the wafers face-to-face allows for a smaller form factor since the AWR devices can be stacked instead of being formed side by side. In order to reduce the form factor even further, embodiments may also include bonding multiple AWR wafers in a stack where at least two of the AWR wafers are oriented face-to-face. Embodiments of the invention also allow for through substrate vias (TSVs) to be formed through only one or even neither of the AWR wafers. This provides even greater savings in manufacturing costs and complexity.

Referring now to FIG. 1, a cross-sectional illustration of an AWR module 150 with a first AWR device 161 and a second AWR device 162 is shown, according to an embodiment of the invention. As shown, the first AWR device 161 is fabricated on a first AWR substrate 121 and the second AWR device 162 is fabricated on a second AWR substrate 122. Embodiments of the invention may include first and second AWR substrates 121/122 that are suitable for fabricating AWR devices and electrical routing for making electrical connections to the AWRs 161/162. The first and second AWR substrates 121/122 may be semiconductor substrates (e.g., silicon substrates, etc.). As used herein, a "substrate" may be considered a wafer or a die depending on which stage of fabrication is being discussed. For example, a substrate may refer to a wafer prior to dicing or to a die after the wafer is diced into individual dies. The first and second AWR substrates 121/122 may also include one or more backend interconnect layers 124 that are used for routing electrical traces needed to provide electrical connections to the first or second AWR devices 161/162.

Surface 131 of the first AWR substrate 121 and surface 132 of the second AWR substrate 122 may be oriented so that they face each other (i.e., face-to-face). The first AWR substrate 121 and the second AWR substrate 122 may be bonded together with a sealing frame 110. In an embodiment, the sealing frame 110 may be a solder sealing frame 110. The sealing frame 110 may have a height H. In an embodiment, the height H may be relatively large when compared to the height of a bonding ring used in a metal bonding process used in typical wafer-to-wafer bonding processes. For example, the sealing frame 110 may have a height H that is approximately 1 µm or greater. In an embodiment, the height H of the solder frame 110 may be between approximately 30 µm and 100 µm.

In an embodiment, the first AWR substrate 121, the second AWR substrate 122, and the sealing frame 110 may define a cavity 112 of the AWR module 150. The cavity 112 may be hermetically sealed and provide acoustic isolation to the first AWR device 161 and the second AWR device 162.

In an embodiment, the first and second AWR devices 161/162 may be any well-known resonator, such as but not limited to a TFBAR, an SMR, a CMR, a CLMR, or a SAW device. In the illustrated embodiment, each AWR device 161/162 may include a first electrode 171 and a second electrode 172. The first electrode 171 and the second electrode 172 both contact a piezoelectric layer 173. In the illustrated embodiment, the first electrode 171 is above the piezoelectric layer 173 and the second electrode 172 is below the piezoelectric layer 173, however, embodiments are not limited to such configurations. For example, the first electrode 171 and the second electrode 172 may be formed on the same surface of the piezoelectric layer 173. Furthermore, the electrodes 171/172 and the piezoelectric layer 173 may include any configuration or architecture needed to form the desired type of AWR device. In yet another embodiment, the first AWR device 161 may have a different architecture and/or configuration than the second AWR device 162.

In order to provide different operating frequencies, the first AWR device 161 and the second AWR device 162 may have piezoelectric layers 173 with different thicknesses. As illustrated, the first AWR device 161 has a piezoelectric layer 173 with a thickness $T_1$ and the second AWR device 162 has a piezoelectric layer with a thickness $T_2$ that is different than the thickness $T_1$. In an embodiment, the thickness $T_2$ may be greater than or less than the thickness of $T_1$. Embodiments may include thicknesses $T_1$ and $T_2$ that are between approximately 100 nm and 5 µm.

Furthermore, embodiments of the invention may include a first AWR device 161 that has a piezoelectric layer 173 that is different than the material used for the piezoelectric layer 173 of the second AWR device 162. In an embodiment, the piezoelectric layers 173 may be formed with one or more of aluminum nitride (AlN), lead zirconate titanate (PZT), zinc oxide (ZNO), sodium potassium niobate (KNN) or any other suitable piezoelectric material. Particularly, it is to be appreciated that the use of different piezoelectric materials and forming the piezoelectric layers with different thicknesses does not require complicated processing operations or additional processing operations because the piezoelectric layers are formed on different substrates that undergo different processing.

In order to allow for free movement of the first and second AWR devices 161/162, embodiments may include a trench 128 below each AWR devices 161/162. In an embodiment, the trenches 128 may be formed into the backend interconnect layers 124 or through backend interconnect layers 124 and into the substrates 121/122. In an embodiment, the depth of the trenches 128 are between 300 nm and 5 μm, or any other depth needed to provide unobstructed movement of the AWRs. In an embodiment, the depth of the trench 128 in the first AWR substrate 121 may be a different depth than the depth of the trench 128 in the second AWR substrate 122, or the depths may be substantially similar. It is to be appreciated that fabricating trenches 128 with different depths does not introduce significant processing challenges or additional processing operations because the trenches are formed on different substrates that undergo different processing. In some embodiments, the AWR devices 161/162 may not require a trench 128, and therefore, the trench may be omitted.

According to an embodiment, the first AWR device 161 and the second AWR device 162 may be stacked over each other. Stacking the two AWR devices 161/162 reduces the form factor of the AWR module 150 because there is a reduction in the overall footprint compared to having a first AWR device 161 and a second AWR device 162 that are oriented side by side. As used herein, "stacked" refers to the first AWR device 161 and the second AWR device 162 having footprints in the X-Y plane that at least partially overlap each other even though they are positioned at different Z-heights. While a stacked orientation may provide a reduction in the overall form factor, it is to be appreciated that embodiments of the invention are not limited to a stacked configuration, and embodiments where the footprint of the first AWR device 161 and the footprint of the second AWR device 162 do not overlap each other are also possible configurations.

In some embodiments, electrical connections are made to the first AWR device 161 and the second AWR device 162 with through substrate vias (TSVs) 155. The TSVs 155 may be conductive vias that are formed through the second AWR substrate 122. Due to the face-to-face bonding of the first AWR substrate 121 and the second AWR substrate 122, embodiments allow for the electrical connection to the first AWR device 161 to be made with solder interconnects 157. In an embodiment the solder connections may be substantially the same thickness as the sealing frame 110. It is to be appreciated that such embodiments allow for the first AWR substrate 121 to be formed without TSVs since the surface 131 of the first AWR substrate 121 directly faces the surface 132 of the second AWR substrate 122. Accordingly, manufacturing processes are reduced in the fabrication of the first AWR device 161.

Figure 2:
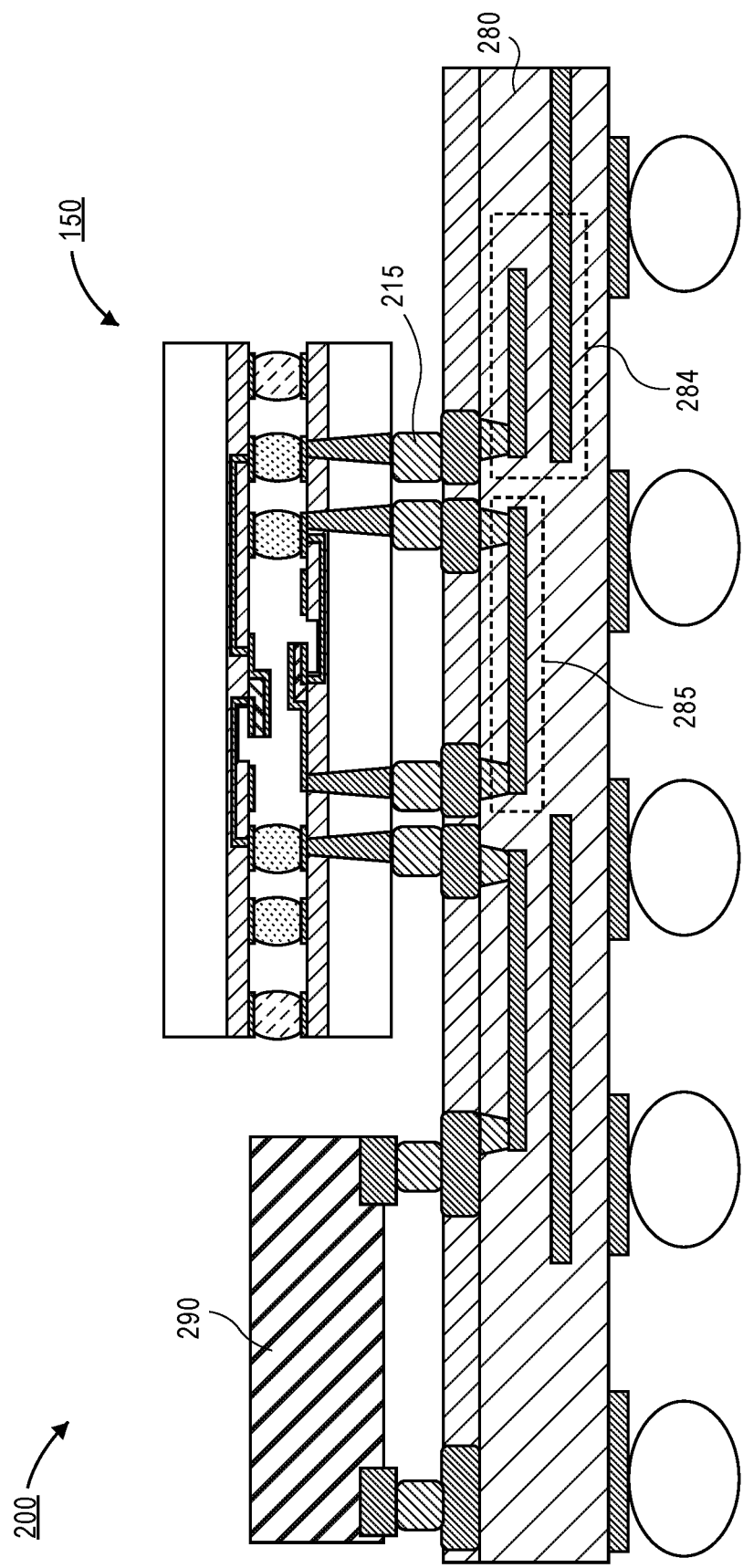
FIG. 2 is a cross-sectional illustration of a hybrid filter that includes an AWR module with two AWR devices with different operating frequencies and passive components, according to an embodiment of the invention.

Referring now to FIG. 2, a cross-sectional illustration of a hybrid filter 200 that includes an AWR module 150 and discrete integrated passive devices is shown, according to an embodiment. In an embodiment, the AWR module 150 may be flip-chip mounted to a packaging substrate 280 with solder bumps 215. While the AWR module 150 is illustrated as being flip-chip-mounted to a top surface of the packaging substrate 280, it is to be appreciated that the AWR module may also be placed in a trench that is formed into the packaging substrate 280, embedded entirely within the packaging substrate, or any other suitable packaging configuration.

The packaging substrate may include one or more embedded passive devices that are used in the hybrid filter architecture. For example, an embedded inductor 285 and an embedded capacitor 284 are formed in one or more layers of the packaging substrate 280. In an embodiment, the embedded inductor 285 may be a single turn or a multi-turn inductor. In an embodiment, the embedded capacitor 284 is shown as a single parallel plate capacitor. However, different embodiments may include any capacitor that may be embedded within the packaging substrate 280. It is to be appreciated that embodiments are not limited to the specific design or configuration of any of the illustrated embedded passive devices. For example, any number of passive devices with any configuration or design may be used in accordance with embodiments of the invention.

In some embodiments a discrete integrated passive device (IPD) 290 may also be included in the hybrid filter 200. In the illustrated embodiment, the IPD 290 is flip-chip mounted to the packaging substrate 280. However, it is to be appreciated that the IPD 290 may be electrically coupled to the packaging substrate 280 with any suitable interconnect technology, such as wire bonds or the like. Additional embodiments may also include an IPD 290 that is embedded within the packaging substrate 280. For example, the IPD 290 may be positioned in a trench formed into the surface of the packaging substrate 280, or the IPD 290 may be completely embedded within the packaging substrate 280.

Figure 3:
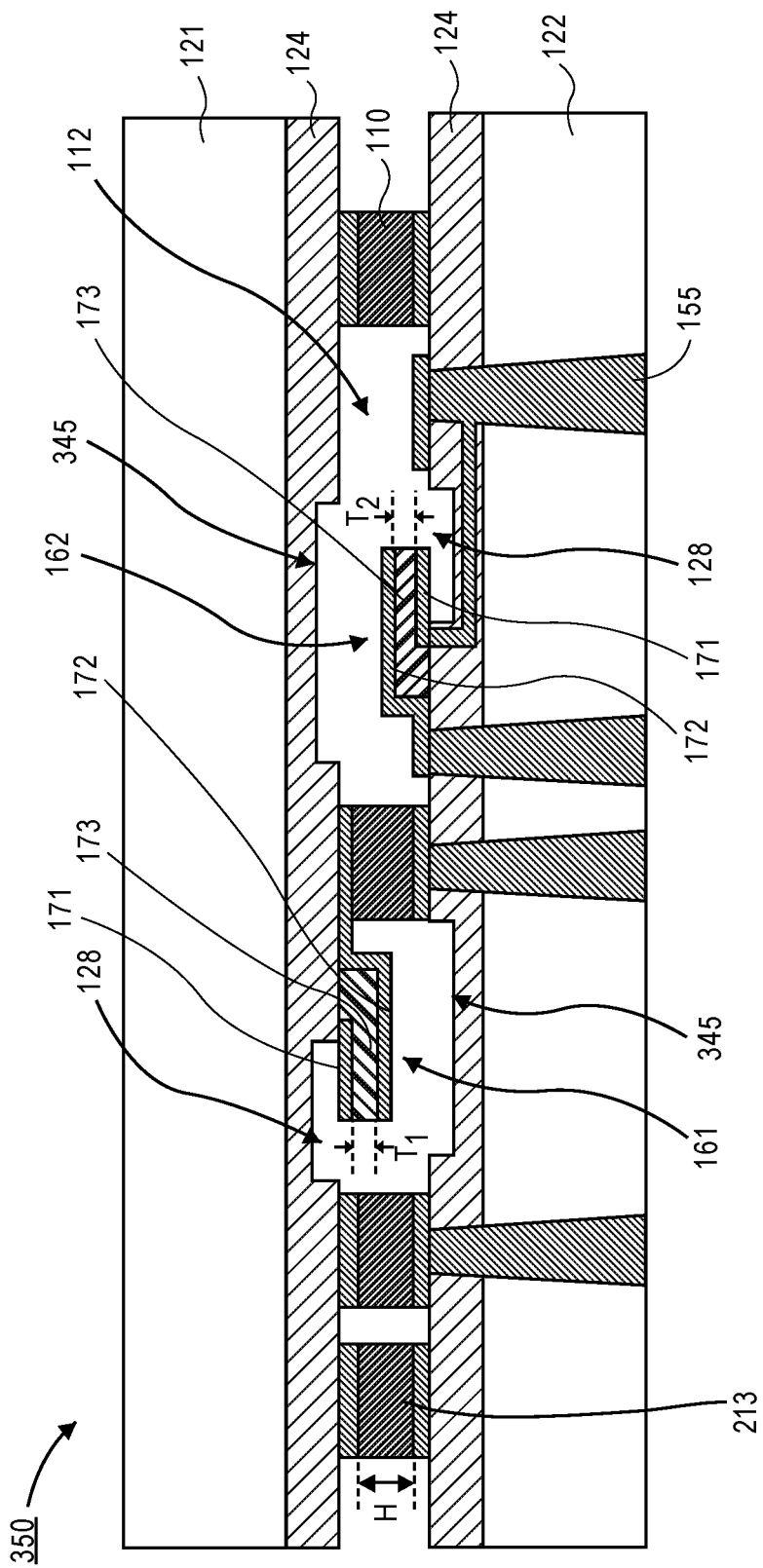
FIG. 3 is a cross-sectional illustration of an AWR module with two AWR devices that are offset from each other, according to an embodiment of the invention.

Referring now to FIG. 3, a cross-sectional illustration of an AWR module 350 is shown, according to an embodiment of the invention. The first and second AWR devices 161/162 of AWR module 350 are substantially similar to the first and second AWR devices 161/162 of AWR module 150, with the exception that the AWR devices 161/162 are not stacked over each other. In such embodiments, a footprint of the first AWR device 161 may not overlap a portion of the footprint of the second AWR device 162. Orienting the first AWR device 161 and the second AWR device 162 in such a manner allows for the height of the AWR module 350 to be reduced compared to the height of the AWR module 150. In some embodiments, a trench 345 may be formed in each of the first and second AWR substrates 121/122 that opposes the AWR devices 161 and/or 162 on the opposite substrate 121 or 122. These trenches 345 provide additional clearance for free unobstructed movement of the AWR devices 161/162. The addition of the trenches 345 is optional depending on the thickness of the sealing frame 110. For example, in FIG. 3, the sealing frame 110 is formed with a metal-to-metal wafer bonding. The height H of the metal used in the bonding may not be sufficient to provide clearance to the AWR devices 161/162 and the trenches 345 are required. In contrast, if the sealing frame 110 has a height H that is sufficient to allow for free movement of the AWR devices 161/162, then the trenches 345 may be omitted. In an embodiment, the trenches 345 may be formed during the formation of the trenches 128, and therefore, do not substantially increase the processing complexity of the AWRs 161/162. In an embodiment, the metal 213 may have a height less than 5 µm. For example the height H of the metal 213 may be between 1 µm and 5 µm.

It is to be appreciated that the AWR module 350 may be packaged with embedded passive devices, IPDs, or the like in substantially the same manner AWR module 150 is packaged in FIG. 2. As such, AWR module 350 may be utilized in a hybrid filter in substantially the same manner AWR module 150 is used.

Figure 4:
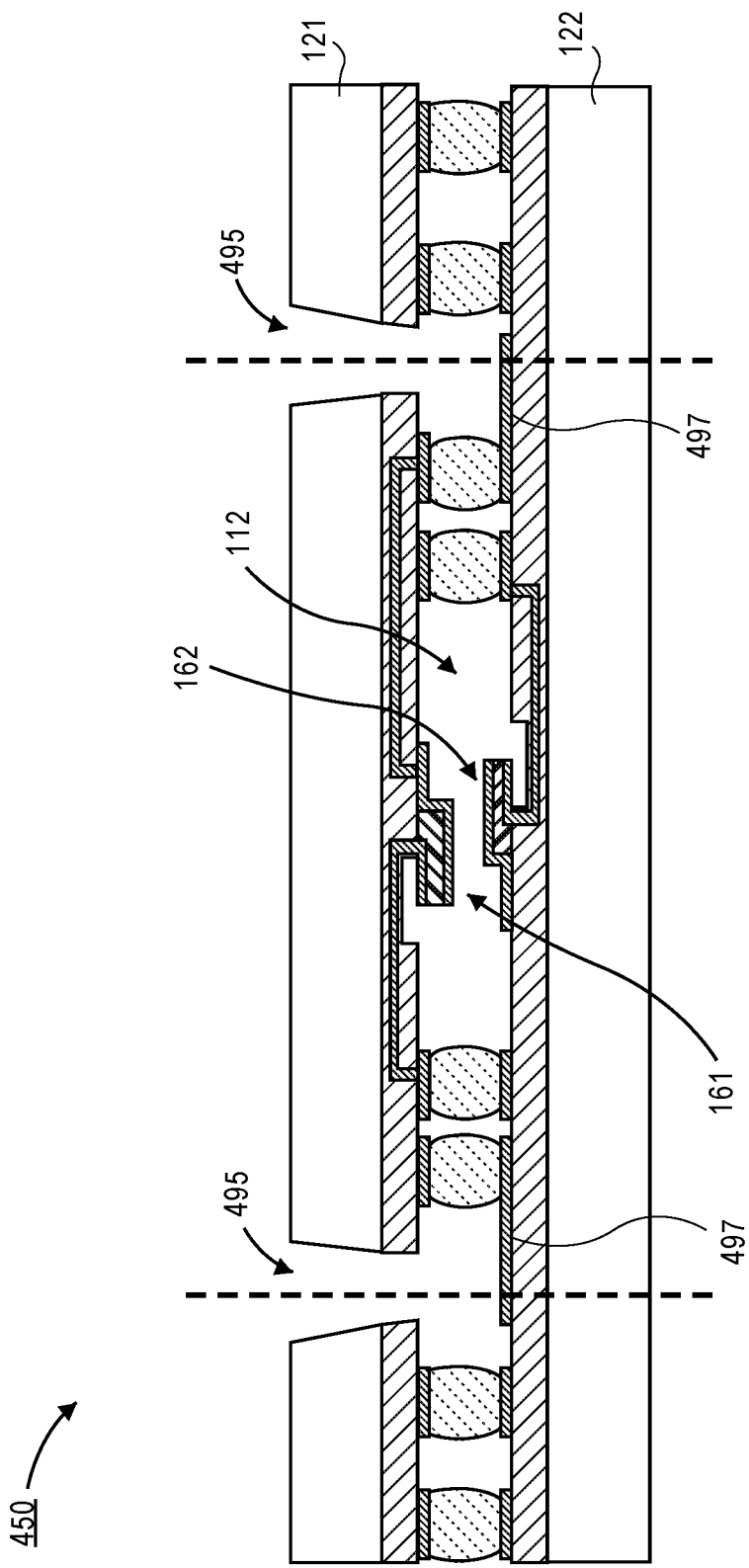
FIG. 4 is a cross-sectional illustration of an AWR module with two AWR devices that includes through-holes along a first AWR substrate that are positioned over contact pads on a second AWR substrate, according to an embodiment of the invention.

Referring now to FIG. 4, a cross-sectional illustration of an AWR module 450 prior to being diced is shown, according to an embodiment of the invention. AWR module 450 is substantially similar to AWR module 150, with the exception that TSVs are omitted. As such, electrical connections to the AWR devices 161/162 may be made with wire-bonding by forming through-holes 495 through the first AWR substrate 121. According to an embodiment, the through-holes 495 are positioned above contact pads 497 on the second AWR substrate 122. The through-holes 495 are then able to function as pathways through which wire bond connections may be made in subsequent processing operations.

In the illustrated embodiment, the through-holes 495 are shown as tapered through-holes, though embodiments are not limited to the exact shape illustrated. Furthermore, embodiments of the invention may also include through-holes 495 that with any shaped cross-section (as viewed from above the first AWR substrate 121). For example, the top-view cross-section of the through-holes 495 may be circular, rectangular, or any other shape.

In an embodiment, the through-holes may be formed with any suitable process. For example, the through-holes 495 may be formed with a deep reactive ion etching (DRIE) process or any other suitable etching process. In an embodiment, the through-holes 495 may be formed before the cavity 112 is sealed. The cavity 112 may be sealed with any suitable sealing frame formed around the cavity 112. The sealing frame may be fully conductive (e.g., a solder frame) or the sealing frame may incorporate a thin dielectric layer to accommodate for any routing that needs to be performed under the seal frame. After the sealing frame is formed, the AWR module 450 may be diced along saw streets (as indicated by the dashed lines). In an embodiment, the saw streets may coincide with a portion of the through-holes 495.

Figure 5:
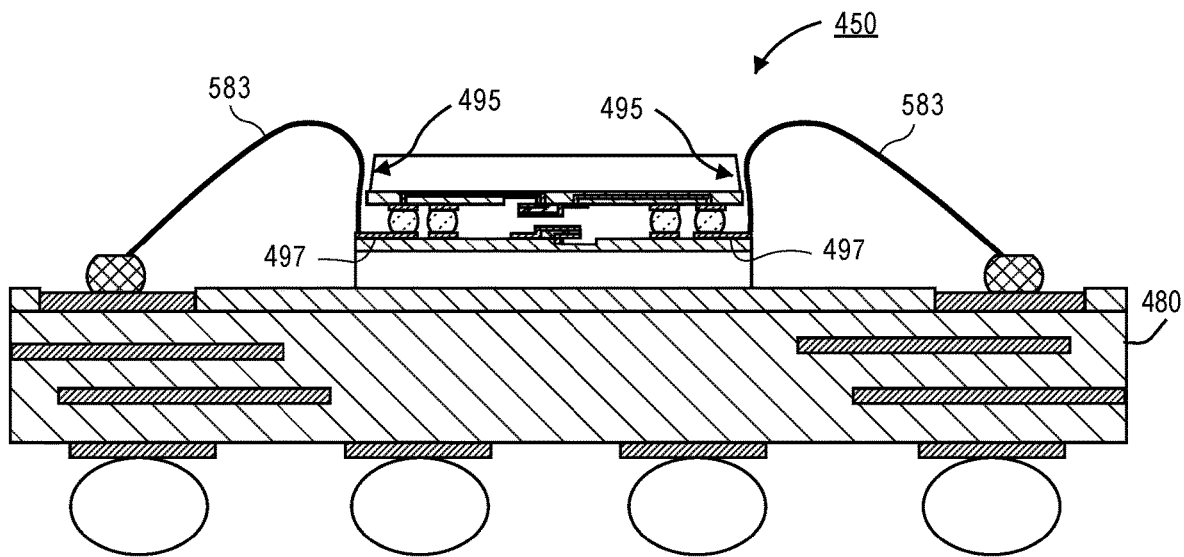
FIG. 5 is a cross-sectional illustration of a hybrid filter that includes an AWR module with two AWR devices with different operating frequencies that is electrically coupled to the packaging substrate with wire bonds.

As illustrated in FIG. 5, a cross-sectional view of the AWR module 450 after it has been attached to a packaging substrate 480 is shown, according to an embodiment of the invention. As shown, wire bonds 583 may pass through the through-holes 495 in order to make electrical connections with the contact pads 497. Accordingly, there is no need for any TSVs in such an embodiment. While the through-hole architecture is shown in conjunction with an AWR module similar to the AWR module 150 illustrated in FIG. 1, it is to be appreciated that AWR modules with other AWR device configurations (e.g., AWR module 350 illustrated in FIG. 3) may also utilize the through-hole architecture instead of using the TSV architecture. The elimination of TSVs allows for simplified fabrication of the AWR module and overall cost reduction for hybrid filters described herein.

Figure 6A:
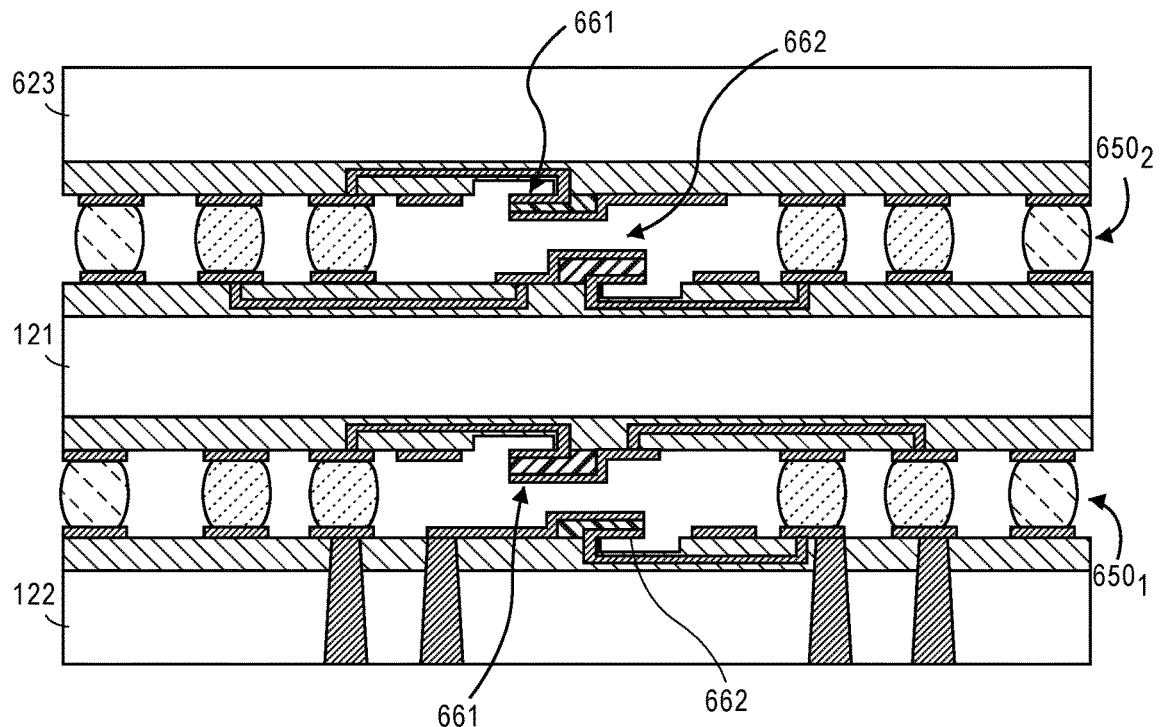
FIG. 6A is a cross-sectional illustration of two AWR modules stacked on each other, where each AWR module includes two AWR devices that have different operating frequencies, according to an embodiment of the invention.

Referring now to FIG. 6A, a cross-sectional illustration of two AWR modules stacked over each other is shown, according to an embodiment of the invention. The first AWR module 6501 and the second AWR module 6502 are substantially similar to AWR module 150 illustrated in FIG. 1 and are stacked on top of each other. In an embodiment the second AWR device 662 of the second AWR module 6502 may be formed on the backside of the first AWR substrate 121. In an embodiment, the second AWR device 662 of the first AWR module 6501 may be fabricated on a fourth substrate 122 that is electrically coupled to the first AWR substrate 121 with wafer-to-wafer bonding (e.g., metal plating or solder bumps) and that includes TSVs that are formed out of the plane as illustrated in FIG. 6A. The first AWR device 661 on the second AWR module 6502 may formed on a third substrate 623 that is substantially similar to the first AWR substrate 121 in FIG. 1.

It is to be appreciated that the configuration of the stacked AWR modules in FIG. 6A are not limited to the architecture shown. For example, one or both of the AWR modules 6501 and 6502 may utilize architectures where the AWR devices are not stacked over each other, or one or both of the AWR modules may include through-hole architectures similar to what was illustrated in FIG. 4 in order to allow for wire bonding. In such embodiments, there may be a reduction in the number of substrates that require TSVs or the TSVs may be eliminated completely. Additionally, while two stacked AWR modules are illustrated, it is to be appreciated that any number of AWR modules may be stacked over each other in a similar configuration.

Figure 6B:
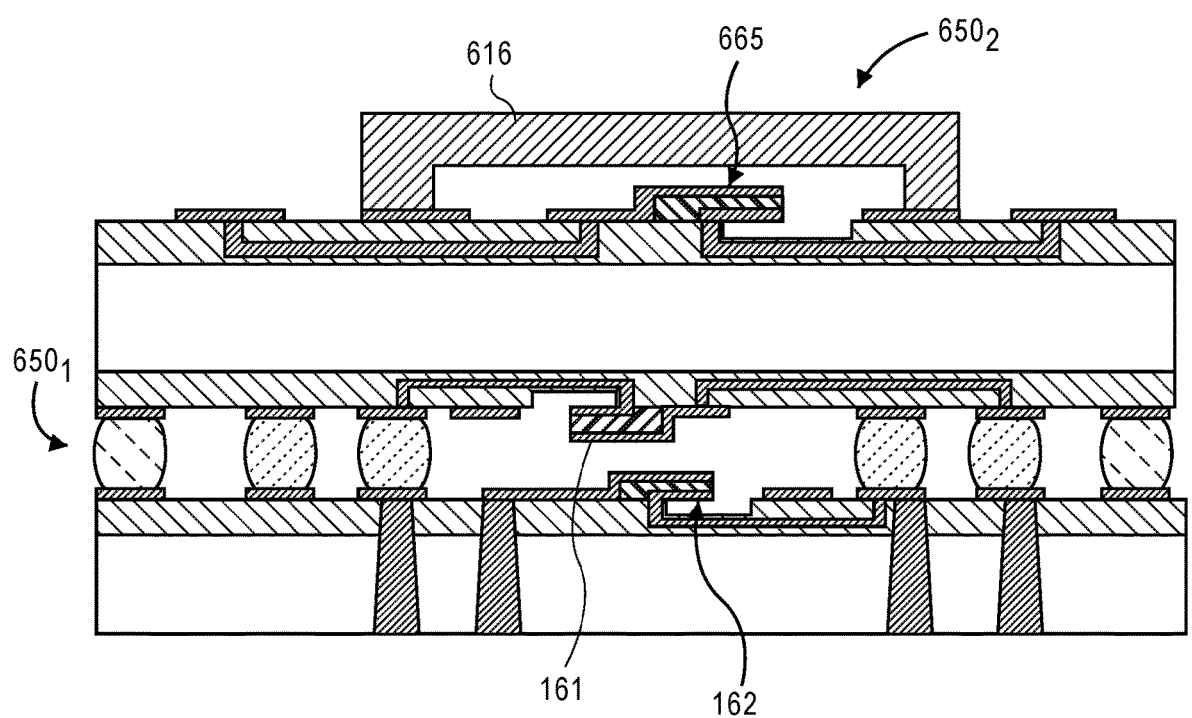
FIG. 6B is a cross-sectional illustration of an AWR module with two AWR devices that have different central operating frequencies, and an AWR module with a single AWR device stacked over it, according to an embodiment of the invention.

Referring now to FIG. 6B, a cross-sectional illustration of stacked AWR modules is shown, according to an additional embodiment of the invention. In FIG. 6B, the first AWR module 6501 is formed using one of the architectures described with respect to FIG. 1, and the second AWR module 6502 is an AWR module that only includes a single AWR device 665. In such embodiments, the AWR device 665 may be formed in an AWR module that is enclosed by a lid 616 or other enclosure, as is known in the art. Such embodiments, where a single AWR device 665 is positioned over an AWR module formed with two AWR devices with different operating frequencies, may be utilized with any of the architectures described in greater detail herein.

Figure 7:
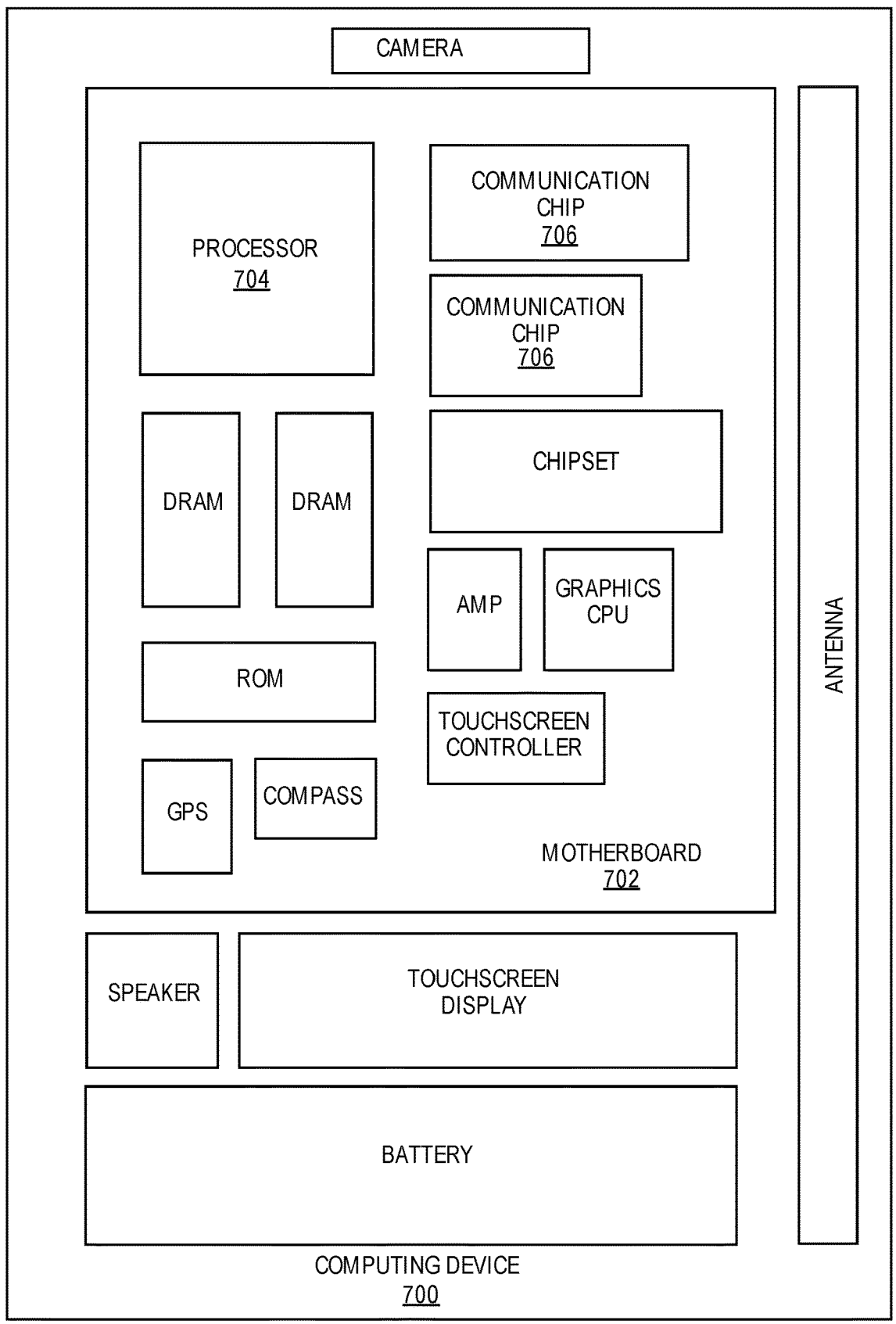
FIG. 7 is a schematic of a computing device built in accordance with an embodiment of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may include an AWR module with two AWR devices that have different center operating frequencies in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as devices may include an AWR module with two AWR devices that have different center operating frequencies in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 may be an acoustic wave resonator (AWR) module, comprising: a first AWR substrate; a second AWR substrate affixed to the first AWR substrate, wherein the first AWR substrate and the second AWR substrate define a hermetically sealed cavity; a first AWR device within the cavity and formed on the first AWR substrate; and a second AWR device within the cavity and formed on the second AWR substrate, wherein a center frequency of the first AWR device is different than a center frequency of the second AWR device.

Example 2 may include the AWR module of Example 1, wherein the first AWR device and the second AWR device each comprise a first electrode, a second electrode, and a piezoelectric layer, and wherein a thickness of the piezoelectric layer of the first AWR device is a different thickness than the piezoelectric layer of the second AWR device.

Example 3 may include the AWR module of Example 1 or Example 2, wherein through substrate vias are formed through only one of the first AWR substrate and the second AWR substrate.

Example 4 may include the AWR module of Example 1, Example 2, or Example 3, wherein a footprint of the first AWR device at least partially overlaps a footprint of the second AWR device.

Example 5 may include may include the AWR module of Examples 1-4, wherein the first AWR substrate is affixed to the second AWR substrate by a solder sealing frame.

Example 6 may include may include the AWR module of Examples 1-5, wherein the solder sealing frame has a thickness greater than 1 μm.

Example 7 may include the AWR module of Examples 1-6, wherein a footprint of the first AWR device does not overlap a footprint of the second AWR device.

Example 8 may include the AWR module of Examples 1-7, wherein a first depression is formed in the first AWR substrate and a second depression is formed in the second AWR substrate, wherein a footprint of the first depression at least partially overlaps the footprint of the second AWR device, and wherein a footprint of the second depression at least partially overlaps the footprint of the first AWR device.

Example 9 may include the AWR module of Examples 1-8, wherein the first AWR substrate is affixed to the second AWR substrate with a metal-to-metal wafer bonding process.

Example 10 may include the AWR module of Examples 1-9, wherein a through-hole in the first AWR substrate is formed above a resonator pad on the second AWR substrate.

Example 11 may include the AWR module of Examples 1-10, wherein the first AWR substrate is affixed to the second AWR substrate by a solder sealing frame.

Example 12 may include the AWR module of Examples 1-11, wherein the first AWR substrate is affixed to the second AWR substrate with a metal-to-metal wafer bonding process.

Example 13 may include the AWR module of Examples 1-12, wherein no through substrate vias are formed through the first AWR substrate or the second AWR substrate.

Example 14 may include the AWR module of Examples 1-13, wherein the thicknesses of the piezoelectric layers of the first AWR device and the second AWR device are between 100 nm and 5 μm.

Example 15 may include the AWR module of Examples 1-14, further comprising a third AWR device formed on a surface of the first AWR substrate opposing the cavity.

Example 16 may include the AWR module of Examples 1-15, wherein the third AWR device is hermetically sealed by a lid or a third AWR substrate.

Example 17 may include the AWR module of Examples 1-16, wherein the first AWR device and the second AWR device are one of a thin film bulk acoustic wave resonator (TFBAR), a solidly mounted resonator (SMR), a contour-mode resonator (CMR), a composite longitudinal mode resonator (CLMR), or a surface acoustic wave (SAW) device.

Example 18 may include a hybrid filter, comprising: a packaging substrate; an acoustic wave resonator (AWR) module mounted to the packaging substrate, wherein the AWR module includes a first AWR device and a second AWR device, wherein the center frequencies of the first AWR device and the second AWR device are not the same, and wherein a second AWR substrate is affixed to a first AWR substrate, wherein the first AWR substrate and the second AWR substrate define a hermetically sealed cavity around the first AWR device and the second AWR device; and one or more RF passive devices embedded in the packaging substrate and electrically coupled to the AWR module.

Example 19 may include the hybrid filter of Example 18, wherein the AWR module is flip-chip mounted to the packaging substrate.

Example 20 may include the hybrid filter of Examples 18 or 19, wherein the first AWR device and the second AWR device each comprise a first electrode, a second electrode, and a piezoelectric layer, and wherein a thickness of the piezoelectric layer of the first AWR device is a different thickness than the piezoelectric layer of the second AWR device.

Example 21 may include the hybrid filter of Examples 18-20, wherein the AWR module is electrically coupled to the one or more RF passive devices with wire bonds.

Example 22 may include the hybrid filter of Examples 18-21, wherein a through-hole in the first AWR substrate is formed above a resonator pad on the second AWR substrate.

Example 23 may include the hybrid filter of Examples 18-22, further comprising one or more discrete integrated passive devices that are mounted on the packaging substrate.

Example 24 may include the hybrid filter of Examples 18-23, wherein the first AWR device and the second AWR device are one of a thin film bulk acoustic wave resonator (TFBAR), a solidly mounted resonator (SMR), a contour-mode resonator (CMR), a composite longitudinal mode resonator (CLMR), or a surface acoustic wave (SAW) device.

Example 25 may include a hybrid filter, comprising: a packaging substrate; an acoustic wave resonator (AWR) module mounted to the packaging substrate, wherein the AWR module comprises: a first AWR substrate; a second AWR substrate affixed to the first AWR substrate, wherein the first AWR substrate and the second AWR substrate define a hermetically sealed cavity; a first AWR device within the cavity and formed on the first AWR substrate; and a second AWR device within the cavity and formed on the second AWR substrate, wherein a center frequency of the first AWR device is different than a center frequency of the second AWR device; and one or more RF passive devices embedded in the packaging substrate and electrically coupled to the AWR module.

Example 26 may include the hybrid filter of Example 25, wherein an through-hole in the first AWR substrate is formed above a resonator pad on the second AWR substrate, and wherein the AWR module is electrically coupled to the one or more RF passive devices with wire bonds.

Example 27 may include the hybrid filter of Examples 25 or 26, wherein a footprint of the first AWR device does not overlap a footprint of the second AWR device, and wherein a first depression is formed in the first AWR substrate and a second depression is formed in the second AWR substrate, wherein a footprint of the first depression at least partially overlaps the footprint of the second AWR device, and wherein a footprint of the second depression at least partially overlaps the footprint of the first AWR device.

Example 28 may include the hybrid filter of Examples 25-27, wherein the first AWR device and the second AWR device are one of a thin film bulk acoustic wave resonator (TFBAR), a solidly mounted resonator (SMR), a contour-mode resonator (CMR), a composite longitudinal mode resonator (CLMR), or a surface acoustic wave (SAW) device.

What is claimed is:

1. An acoustic wave resonator (AWR) module, comprising:
   a first AWR substrate;
   a second AWR substrate affixed to the first AWR substrate, wherein the first AWR substrate and the second AWR substrate define a hermetically sealed cavity;
   a first AWR device within the cavity and formed on the first AWR substrate, the first AWR device having a first suspended end; and
   a second AWR device within the cavity and formed on the second AWR substrate, the second AWR device having a second suspended end, wherein a center frequency of the first AWR device is different than a center frequency of the second AWR device.

2. The AWR module of claim 1, wherein the first AWR device and the second AWR device each comprise a first electrode, a second electrode, and a piezoelectric layer, and wherein a thickness of the piezoelectric layer of the first AWR device is a different thickness than the piezoelectric layer of the second AWR device.

3. The AWR module of claim 2, wherein through substrate vias are formed through only one of the first AWR substrate and the second AWR substrate.

4. The AWR module of claim 2, wherein a footprint of the first AWR device at least partially overlaps a footprint of the second AWR device.

5. The AWR module of claim 4, wherein the first AWR substrate is affixed to the second AWR substrate by a solder sealing frame.

6. The AWR module of claim 5, wherein the solder sealing frame has a thickness greater than 1 μm.

7. The AWR module of claim 2, wherein a footprint of the first AWR device does not overlap a footprint of the second AWR device.

8. The AWR module of claim 7, wherein a first depression is formed in the first AWR substrate and a second depression is formed in the second AWR substrate, wherein a footprint of the first depression at least partially overlaps the footprint of the second AWR device, and wherein a footprint of the second depression at least partially overlaps the footprint of the first AWR device.

9. The AWR module of claim 7, wherein the first AWR substrate is affixed to the second AWR substrate with a metal-to-metal wafer bonding process.

10. The AWR module of claim 2, wherein a through-hole in the first AWR substrate is formed above a resonator pad on the second AWR substrate.

11. The AWR module of claim 10, wherein the first AWR substrate is affixed to the second AWR substrate by a solder sealing frame.

12. The AWR module of claim 10, wherein the first AWR substrate is affixed to the second AWR substrate with a metal-to-metal wafer bonding process.

13. The AWR module of claim 10, wherein no through substrate vias are formed through the first AWR substrate or the second AWR substrate.

14. The AWR module of claim 1, further comprising a third AWR device formed on a surface of the first AWR substrate opposing the cavity.

15. The AWR module of claim 14, wherein the third AWR device is hermetically sealed by a lid or a third AWR substrate.

16. The AWR module of claim 1, wherein the first AWR device and the second AWR device are one of a thin film bulk acoustic wave resonator (TFBAR), a solidly mounted resonator (SMR), a contour-mode resonator (CMR), a composite longitudinal mode resonator (CLMR), or a surface acoustic wave (SAW) device.

17. A hybrid filter, comprising:
a packaging substrate;
an acoustic wave resonator (AWR) module mounted to the packaging substrate, wherein the AWR module includes a first AWR device and a second AWR device, the first AWR device having a first suspended end, and the second AWR device having a second suspended end, wherein the center frequencies of the first AWR device and the second AWR device are not the same, and wherein a second AWR substrate is affixed to a first AWR substrate, wherein the first AWR substrate and the second AWR substrate define a hermetically sealed cavity around the first AWR device and the second AWR device; and
one or more RF passive devices embedded in the packaging substrate and electrically coupled to the AWR module.

18. The hybrid filter of claim 17, wherein the AWR module is flip-chip mounted to the packaging substrate.

19. The hybrid filter of claim 18, wherein the first AWR device and the second AWR device each comprise a first electrode, a second electrode, and a piezoelectric layer, and wherein a thickness of the piezoelectric layer of the first AWR device is a different thickness than the piezoelectric layer of the second AWR device.

20. The hybrid filter of claim 17, wherein the AWR module is electrically coupled to the one or more RF passive devices with wire bonds.

21. The hybrid filter of claim 20, wherein a through-hole in the first AWR substrate is formed above a resonator pad on the second AWR substrate.

22. The hybrid filter of claim 17, further comprising one or more discrete integrated passive devices that are mounted on the packaging substrate.

23. A hybrid filter, comprising:
a packaging substrate;
an acoustic wave resonator (AWR) module mounted to the packaging substrate, wherein the AWR module comprises:
a first AWR substrate;
a second AWR substrate affixed to the first AWR substrate, wherein the first AWR substrate and the second AWR substrate define a hermetically sealed cavity;
a first AWR device within the cavity and formed on the first AWR substrate, the first AWR device having a first suspended end; and
a second AWR device within the cavity and formed on the second AWR substrate, the second AWR device having a second suspended end, wherein a center frequency of the first AWR device is different than a center frequency of the second AWR device; and
one or more RF passive devices embedded in the packaging substrate and electrically coupled to the AWR module.

24. The hybrid filter of claim 23, wherein an through-hole in the first AWR substrate is formed above a resonator pad on the second AWR substrate, and wherein the AWR module is electrically coupled to the one or more RF passive devices with wire bonds.

25. The hybrid filter of claim 23, wherein a footprint of the first AWR device does not overlap a footprint of the second AWR device, and wherein a first depression is formed in the first AWR substrate and a second depression is formed in the second AWR substrate, wherein a footprint of the first depression at least partially overlaps the footprint of the second AWR device, and wherein a footprint of the second depression at least partially overlaps the footprint of the first AWR device.

* * * * *